(12) United States Patent
Slavin

(10) Patent No.: US 7,161,515 B2
(45) Date of Patent: Jan. 9, 2007

(54) CALIBRATION SYSTEM AND METHOD FOR A LINEARITY CORRECTOR USING FILTER PRODUCTS

(75) Inventor: Keith R. Slavin, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/258,237

(22) Filed: Oct. 26, 2005

(65) Prior Publication Data

US 2006/0092058 A1 May 4, 2006

Related U.S. Application Data

(60) Provisional application No. 60/625,372, filed on Nov. 4, 2004.

(51) Int. Cl.
*H03M 1/84* (2006.01)
(52) U.S. Cl. ..................................... 341/139; 341/120
(58) Field of Classification Search ......... 341/120–155
See application file for complete search history.

(56) References Cited

U.S. PATENT DOCUMENTS

| 5,594,612 | A | 1/1997 | Henrion |
| 6,384,757 | B1 * | 5/2002 | Kosonen ..................... 341/120 |
| 6,639,537 | B1 | 10/2003 | Raz |
| 6,897,794 | B1 * | 5/2005 | Kuyel et al. ................ 341/120 |

OTHER PUBLICATIONS

Taiho Koh et al, "Second-Order Volterra Filtering and Its Application to Nonlinear System Identification", IEEE Transactions vol. ASSP-33 No. 6, Dec. 1985.
Zhang Jia-Shu et al "A Reduced Parameter Second-Order Volterra Filter with Application to Nonlinear Adaptive Prediction of Chaotic Time Series" Chin. Phys Soc vol. 50 Jul. '2001.
Walter Frank, "Compensation of Linear & Nonlinear Sensor Distortions by Digital Post Processing", (Sensor 95) pp. 889-892, "No Month" "No Year".
Walter Frank et al, "Realtime Loudspeaker Linearization", IEEE Winter Workshop 1993, "No Month" No Year .
Konstantina Karagianni et al, "Efficient Third-Order Volterra Filter Computation in the Time Domain", IEEE U.S., Nov. 2003.

* cited by examiner

*Primary Examiner*—Lam T. Mai
(74) *Attorney, Agent, or Firm*—Matthew D. Rabdau

(57) ABSTRACT

A calibration system for calibrating a linearity corrector using the sum of filter products is proved, along with a method of calibrating the linearity corrector. The calibration system includes a first and second signal generator for introducing test signals into a signal processing system, such as an ADC. An acquisition memory and processor are provided for acquiring and analyzing the output of the signal processing system and then programming the filter coefficients into the linearity corrector. The method of calibration analyzes acquired intermodulation and harmonic components from the signal processing system and then finds the amplitude and phase response for the filters. The amplitude and phase response is then used to determine a set of filter coefficients.

21 Claims, 10 Drawing Sheets

CALIBRATION SYSTEM AND METHOD FOR A LINEARITY CORRECTOR USING FILTER PRODUCTS

CROSS-REFERENCE

This application claims the benefit of U.S. provisional application No. 60/625,372 filed Nov. 4, 2004.

COMPUTER PROGRAM LISTING APPENDIX ON COMPACT DISC

Attached herewith are two compact discs (Copy 1 and Copy 2). These discs are identical copies. Each disc includes 1 ASCII file comprising a computer program listing appendix. All material therein is hereby incorporated by reference in this application. The name and indicated size of the file on the compact disc are: Slavin.txt (66 Kbytes). This file includes example source code illustrating specific implementations of specific embodiments of the invention along with explanatory text. These compact discs were created on Oct. 24, 2005, and are in Microsoft® Windows format.

COPYRIGHT NOTIFICATION

Pursuant to 37 C.F.R. 1.71(e), applicants note that a portion of this disclosure contains material that is subject to and for which is claimed copyright protection, such as, but not limited to, source code listings, screen shots, user interfaces, or user instructions, or any other aspects of this submission for which copyright protection is or may be available in any jurisdiction. The copyright owner has no objection to the facsimile reproduction by anyone of the patent document or patent disclosure, as it appears in the Patent and Trademark Office patent file or records. All other rights are reserved, and all other reproduction, distribution, creation of derivative works based on the contents, public display, and public performance of the application or any part thereof are prohibited by applicable copyright law.

BACKGROUND OF THE INVENTION

The present invention relates to linearity error correction, and more particularly to a linearity corrector using filter products to reduce, or eliminate, distortion generated by signal processing systems, such as an analog to digital converter (ADC).

Reducing distortion produced by ADCs increases the spurious-free dynamic range (SFDR), which is useful for systems that use ADCs to acquire data, such as spectrum analyzers, and other electronic measurement instruments.

Modern high-speed ADC designs use a deep clock pipeline to help accurately convert an analog input to a sampled digital representation in a series of refining steps. The ADC designers make significant efforts to remove obvious sources of nonlinearities in the analog processing circuits. However, it is typically difficult to remove all sources of errors. Designers tend to remove the most obvious problems of the circuit until computerized modeling, for example SPICE modeling, shows that the converter meets specifications. Linearity can be improved using techniques such as reducing dynamic range at the nonlinear device, or using feedback around it. However, some circuit topologies have inherent distortion mechanisms that cannot be completely removed.

Pipelined processing also provides opportunities for internal digital and analog circuit activity to modulate the processing of internal analog signals. In many such cases, the residual nonlinear distortion is generated by self-modulation of the input signal with a linear function of itself or its own derivative. This results in some lower level distortions that are hard to eliminate. Such modulation could occur via the internal power supply distribution. In this case, the number of circuit paths that can generate voltage modulation on the power supply rails may be quite high. Simulating these effects complicates device modeling, and slows computerized simulations. To first order, these contributions to power supply modulation will add almost linearly, so they can be modeled as a linear finite impulse response (FIR) filter.

At one, or more, points in analog signal processing, modulation occurs, which corresponds to a multiplication. In pipelined ADCs, modulation typically occurs in the high gain analog amplifiers between conversion stages. In this situation, the harmonic and intermodulation distortion is typically characterized by the presence of $2^{nd}$ and $3^{rd}$ order distortion terms, with very little higher-order distortion occurring.

Previous proposed solutions have been based on Volterra Filters. The impulse response of ADCs can be many clock periods, for example 64 clock periods may be used. The correcting system using Volterra Filters would require a similar response length. In a $3^{rd}$-order distortion Volterra system this results in a filter of on the order of $(N^3)/6$ taps, which for a correcting system having a response length of 64 would result in on the order of about 50,000 taps. A filter system with such a large number of taps is too complex and expensive to implement in a practical system at this time.

Another solution has been proposed elsewhere for use in connection with correcting distortion in loud speakers, which utilizes a filter structure that approximates certain aspects of a Volterra filter. FIG. 1 illustrates a version of this solution having a $1^{st}$ order correction and a $3^{rd}$ order correction. The first order compensation is provided by filter 12 ($h_1$). The $3^{rd}$ order compensation is provided by multiplying the output of filter 14 and the output of filter 16 using the multiplier 18, filtering the output from the multiplier 18 using filter 20, multiplying the output of filter 20 with the output of filter 22 using multiplier 24 and finally filtering the output of the multiplier 24 using filter 26. By summing the output from the first order compensation with the third order compensation using adder 28, a linear cubic compensation may be provided. The $3^{rd}$ order compensation of the system shown in FIG. 1 implements the following equation, $$y(n) = \sum_{i=0}^{N_p-1} h_p(i) \sum_{j=0}^{N_a+N_m-2} h_3(j)x(n-i-j)$$

$$\sum_{k=0}^{N_m-1} h_m(k) \cdot \sum_{l=0}^{N_a-1} h_1(l)x(n-l-k-i) \sum_{m=0}^{N_a-1} h_2(m)x(n-m-k-i)$$

which is a described as a general $3^{rd}$ order nonlinear filter structure. This implementation utilizes filter 20 after multiplier 18, and filter 26 after multiplier 24. Once the linear cubic compensation is obtained, it is subtracted from the output of the unknown system that is being compensated. This requires that the corrector have access to the original signal that was input into the unknown system, which is not available where the original signal is not digital. While it may be a useful subcase of a Volterra filter, it has drawbacks that make it unsuitable for systems with a good linear frequency response. The filters following the multipliers cannot distinguish between original components and aliased components caused by the nonlinear effects of the prior multiplications. While additional filtering following the multiplier may provide some correction for frequency-dependent amplitude and phase responses in signal paths, aliasing does not allow the filter to correct for differences in phase and amplitude response between the original and aliased components when used in applications that use most of a Nyquist band.

A remaining problem in linearity compensation systems relates to calibration. These systems may require solving for systems of filter coefficients that are nonlinear with respect to the output. Solving for more coefficients requires more computation for any calibration scheme that can be applied to the system.

The details and improvements over the prior solutions will be discussed in greater detail below.

SUMMARY OF THE INVENTION

If the distortion mechanisms can be modeled by recovering the coefficients of the equivalent distorting filters in the ADC, the ADC output can be passed through a digital processing network that distorts the signal in substantially the same way, and then subtracts the distortion to reduce, or eliminate, the ADC distortion. Although complete elimination of all the ADC distortion is not possible, this method improves the spurious-free dynamic range (SFDR) of an ADC. For example, an ADC with an SFDR of 80 dB may be improved by a factor of 15 dB, depending upon the ADC characteristics. This improvement also removes some filters from prior proposed topologies, thereby simplifying the design for use with systems that have a relatively flat linear frequency response. This simplification can be traded off for longer filters in the correction system, thereby obtaining improved performance with the same amount of processing. The improvement is significant for precision measurement applications, such as those associated with spectrum analyzers, oscilloscopes, or other measurement instruments that use ADCs.

To realize these benefits, a suitable calibration system and method is provided. The calibration system comprises a first analog signal generator producing a first analog signal, a second analog signal generator producing a second analog signal, and an analog adder connected to the first analog signal generator and the second analog signal generator for adding the first analog signal and the second analog signal and providing an analog output. The analog output is input to an ADC such that a digital output is obtained. A linearity corrector implementing a sum of filter products is connected to the digital output of the ADC. During normal operation, the linearity corrector will provide a corrected output having reduced distortion as compared to the output from the ADC. An acquisition memory is connected to the digital output; and a processor for controlling the first signal generator and the second signal generator is connected to read the acquisition memory data. The processor is also connected to the linearity corrector to program filter coefficients for the filter products.

A method of calibrating a linearity corrector is also provided. The calibration method is accomplished by inputting a first waveform and a second waveform into a signal processing system having an output. The acquizition memory and processor acquires and analyzes the intermodulation and harmonic components of the first waveform and the second waveform as each is output from the signal processing system. The amplitude and phase response for filters to be used in a linearity corrector connected to the output of the device are found by determining the minima of an objective function based upon a distortion model and the intermodulation and harmonic components. The amplitude and phase response is then used for calculating a set of filter coefficients.

DETAILED DESCRIPTION OF THE INVENTION

Figure 1:
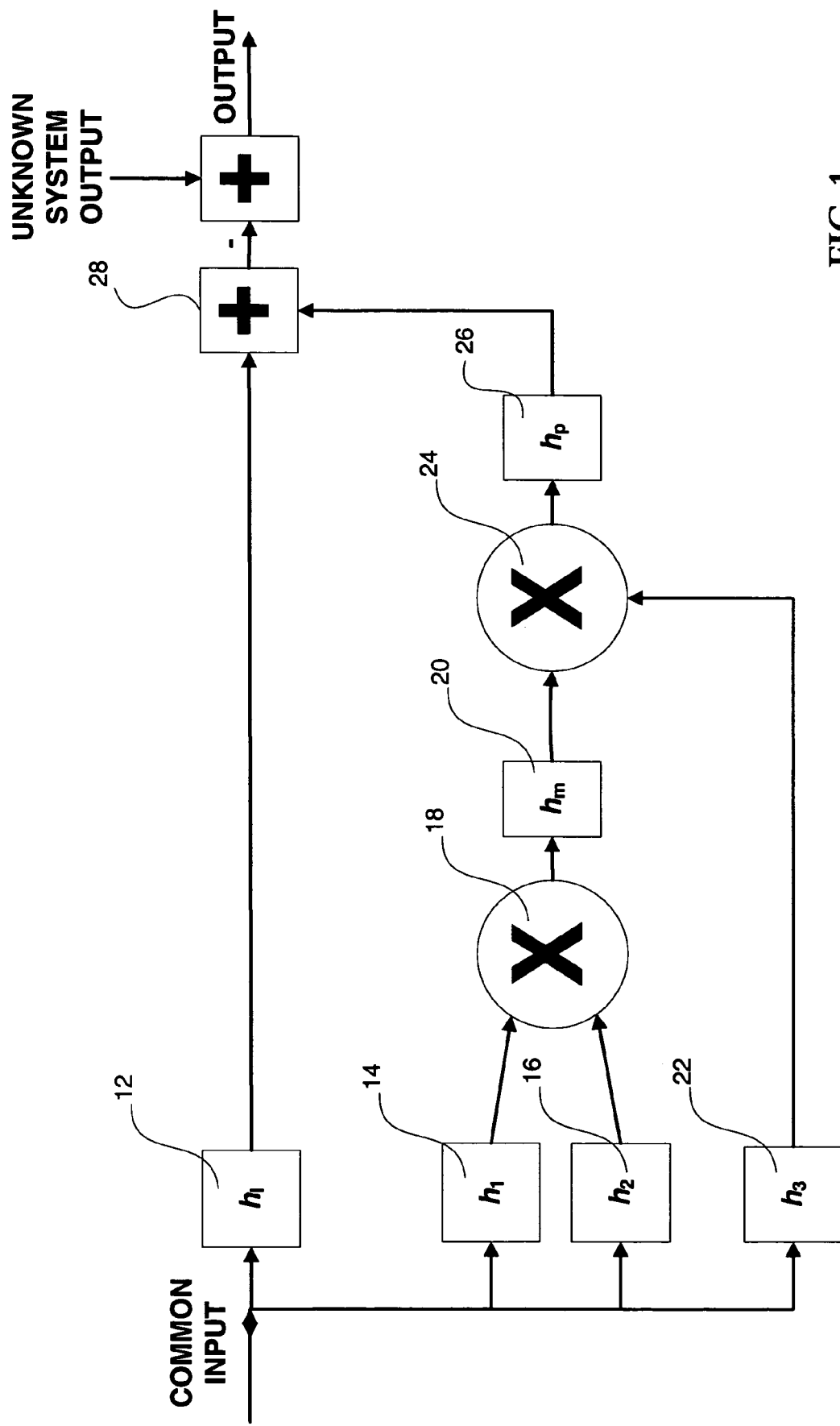
FIG. 1 (PRIOR ART) is a block diagram of a prior art linearity corrector arrangement for compensating loud speakers.

As was mentioned above, previous proposed solutions have been based on Volterra filters. However, since Volterra filters would be very large and difficult to implement in connection with ADCs, a solution that will utilize a more manageable filter design, while still reducing some of the remaining dominant distortions, would be desirable. Taking the Volterra filter as a starting point, the generalized nonlinear filter system can be defined mathematically as:

$$Y(t) = h_0 + \sum_{k=1}^{n}\left(\sum_{j_1=0}^{N-1}\sum_{j_2=0}^{N-1}\cdots\sum_{j_k=0}^{N-1} h_{j_1,j_2,\ldots j_k}\prod_{i=1}^{k} x(t-j_i)\right) \quad (Eq.\ 1)$$

where N is the impulse response length of the filter, and k is the filter order index.

For example, if n=3, then we have the sum of a DC value ($h_0$), a linear FIR filter term at k=1, a $2^{nd}$-order distortion filter at k=2, and a $3^{rd}$-order filter at k=3. Accordingly, for n=3, the Volterra filter can be expressed as:

$$y(t) = h_0 + \sum_{j_1=0}^{N-1} h_{j_1} x(t-j_1) + \sum_{j_1=0}^{N-1}\sum_{j_2=0}^{N-1} h_{j_1,j_2} x(t-j_1)x(t-j_2) + \\ \sum_{j_1=0}^{N-1}\sum_{j_2=0}^{N-1}\sum_{j_3=0}^{N-1} h_{j_1,j_2,j_3} x(t-j_1)x(t-j_2)x(t-j_3) \quad (Eq.\ 2)$$

Volterra filter coefficients are linear with output y, so a set of h can, in theory, be found with training data. Some of the product terms are just permutations of the same sets of input samples, so the number of distinct values, which correspond to the number of filter taps, in the set of h for each order index k is actually given by:

$$\text{Taps}(k)\binom{N+k-1}{N-1} = \frac{\prod_{j=1}^{k}(N+k-j)}{k!} \geq \frac{N^k}{k!} \quad \text{(Eq. 3)}$$

Unfortunately, the impulse response of a pipelined ADC system may be quite large, so N may be large, yielding a very large number of taps for k=3. For example, if the impulse response of the pipelined ADC system were 64 clock periods, such that N=64, then the number of taps required would be approximately 44,000. Additional taps will be required for other order filters, if any.

Embodiments of the present ADC linearity corrector rely on a subset of a Volterra filter system. This subset of the Volterra filter system can be characterized by:

$$y(t) = \sum_{k=1}^{n}\left(\prod_{j=1}^{k}\left(\sum_{i=0}^{N-1} h_{k,j,i}x(t-i)\right)\right) \quad \text{(Eq. 4)}$$

The system order n defines a set of product orders k for $1 \leq k \leq n$.

It is assumed that the distortion model is of this form, although the number and values of the taps is unknown. The correction model has the same form, except that the order, and filter lengths are chosen beforehand, based on experimentation with a particular ADC architecture. Calibration then involves finding the filter taps. Note that the filter taps will, in general, be different for each filter. For system order n=3, and ignoring the $h_0$ (DC) term, we get:

$$y(t) = \sum_{i=0}^{N-1} h_{1,1,i}x(t-i) + \left(\sum_{i=0}^{N-1} h_{2,1,i}x(t-i)\right)\left(\sum_{i=0}^{N-1} h_{2,2,i}x(t-i)\right) + \left(\sum_{i=0}^{N-1} h_{3,1,i}x(t-i)\right)\left(\sum_{i=0}^{N-1} h_{3,2,i}x(t-i)\right)\left(\sum_{i=0}^{N-1} h_{3,3,i}x(t-i)\right) \quad \text{(Eq. 5)}$$

Embodiments of this structure may be characterized by products of N-tap filters with each linear convolution implemented using filters.

Figure 2:
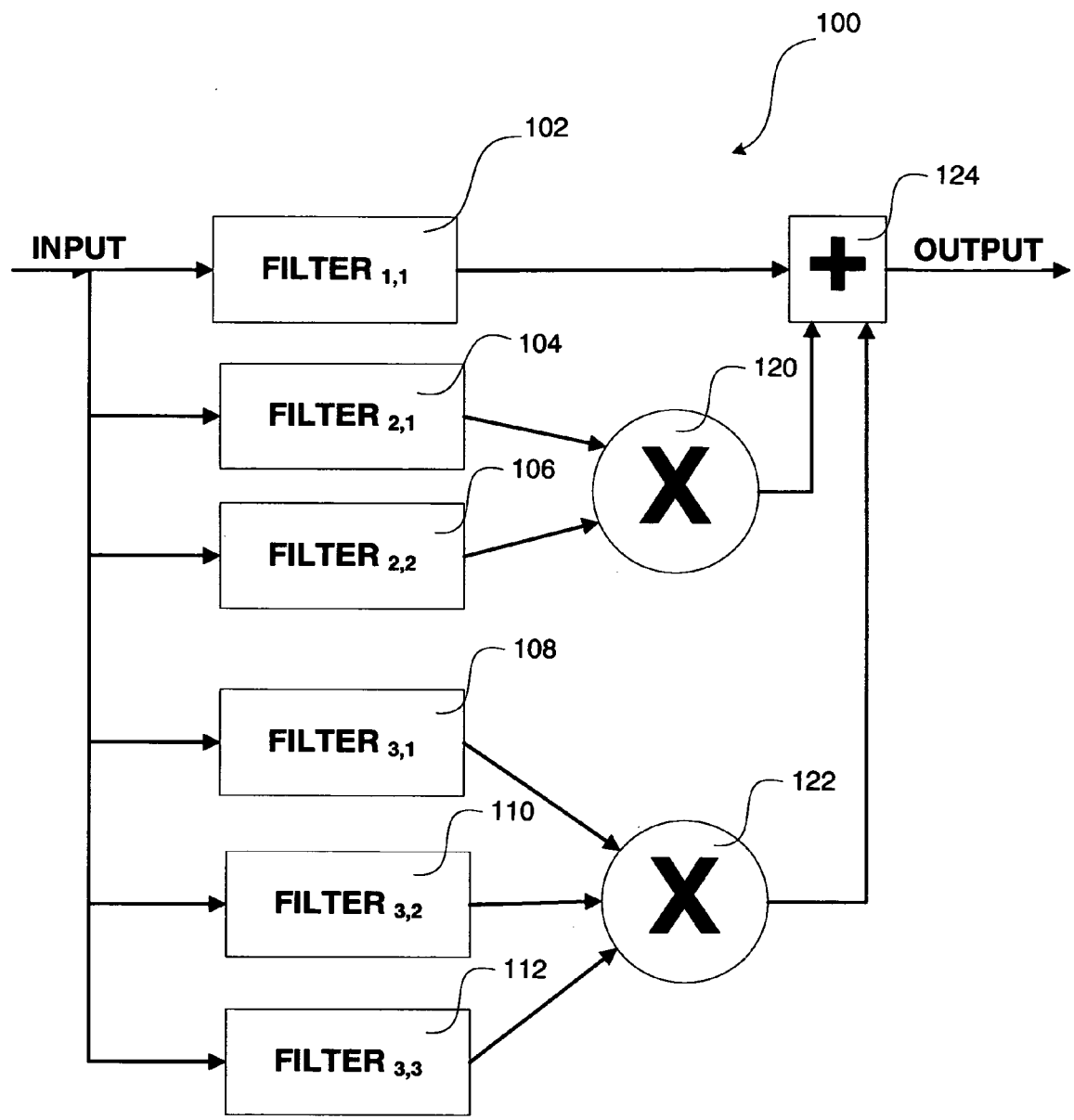
FIG. 2 is a block diagram of a filter product based linearity corrector including compensation for $1^{st}$, $2^{nd}$, and $3^{rd}$ order distortions.

FIG. 2 illustrates an embodiment of a linearity corrector 100 for implementing Eq. 5. The output of a signal processing system, such as an ADC, is provided as the input to the linearity corrector 100. Each of the linear convolutions, as provided in Eq. 5, is implemented using filters 102 through 112. The filters may be implemented as FIR filters. The first order term corresponds to the filter 102. In an alternative embodiment, the first order term is achieved by replacing the filter 102 with a fixed delay equal to approximately half the lengths of the other filters. In another embodiment, the first order term is achieved by replacing the filter 102 with the combination of a fixed delay and a filter, such that the total delay is approximately half the length of the other order filters. The second order term is implemented by multiplying the outputs from filter 104 and filter 106 using a multiplier 120 to produce a $2^{nd}$ order filter product. The third order is implemented by multiplying the outputs from filter 108, filter 110 and filter 112 using multiplier 122 to produce a $3^{rd}$ order filter product. The output from the filter 102 is then added to the output from the multiplier 120 and the multiplier 122 using the adder 124 to provide a simple sum of the filter products as an output. The term simple sum as used herein refers to the operation of adding the multiplier values without additional filtering between the multipliers and the adder 124. This simple sum is achieved by directly connecting the multipliers to the adder. The term directly connecting (or directly connected) as used herein means that there are no filters or other processing elements in the path, there may be registers or other elements in the path that do not change the essential nature of the signal data on the path. The output is now a compensated signal with reduced nonlinearities that were produced by the signal processing system, such as an ADC. It should be noted that embodiments of the present invention have eliminated the filters following the multipliers, which were provided in prior art solutions. While this may require the use of filters having additional taps as compared to the prior art shown in FIG. 1, it makes it possible to use the filters to compensate for certain distortions without needing additional compensation from filters subsequent to the multipliers. For example, if the prior art of FIG. 1 uses an all-pass output filter of a half clock period delay (a so-called sin(x)/x or sin c(x) filter), then this filter can be incorporated into the filters prior to the multiplications. By employing filters only before the multipliers, it is possible for the filter product system to better distinguish between the original components and the aliased components.

While it may reduce the amount of computation by using different length filters in some embodiments, the use of longer length filters may increase the number of variables to solve for during calibration, which tends to slow down the calibration algorithm. For hardware implementations, longer length filters may also require additional delays to match the filter signal delays. Accordingly, in an embodiment of the corrector 100, all of the filter lengths are equal.

Figure 3:
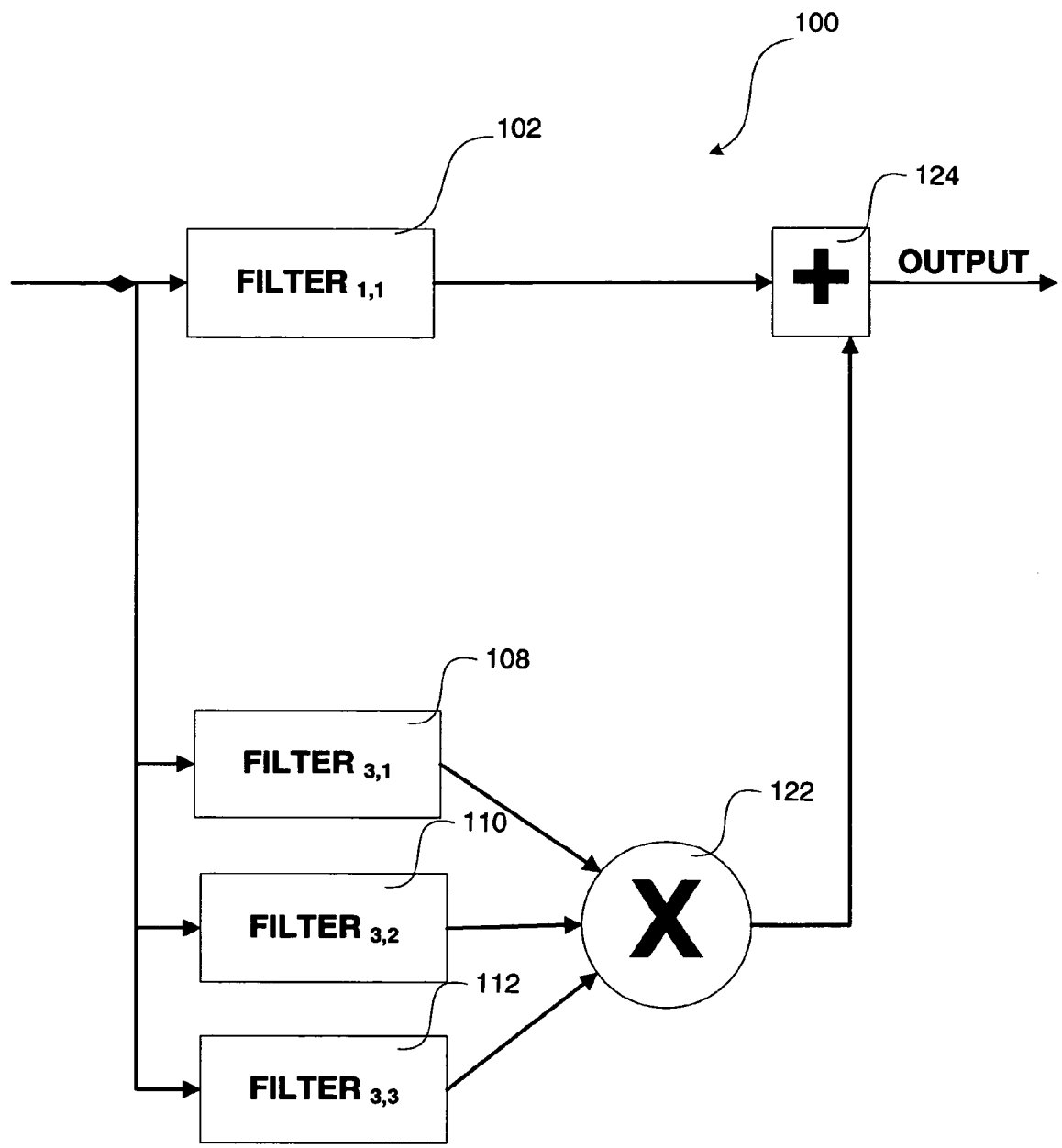
FIG. 3 is a block diagram of a filter product based linearity corrector including compensation for $1^{st}$ and $3^{rd}$ order distortions.

FIG. 3 illustrates an embodiment of a linearity corrector 100 designed to compensate for $1^{st}$ order and $3^{rd}$ order distortion, without compensating for $2^{nd}$ order distortion. In some applications, second order distortion may not be significant enough to justify inclusion of $2^{nd}$ order compensation. As shown in FIG. 3, the $3^{rd}$ order compensation is provided by multiplying the outputs from filter 108, filter 110 and filter 112 using multiplier 122 to produce a $3^{rd}$ order filter product. The simple sum of the $3^{rd}$ order filter product and the first order filter product may then provide a compensated signal having reduced, or eliminated, $1^{st}$ and $3^{rd}$ order distortions.

Figure 4:
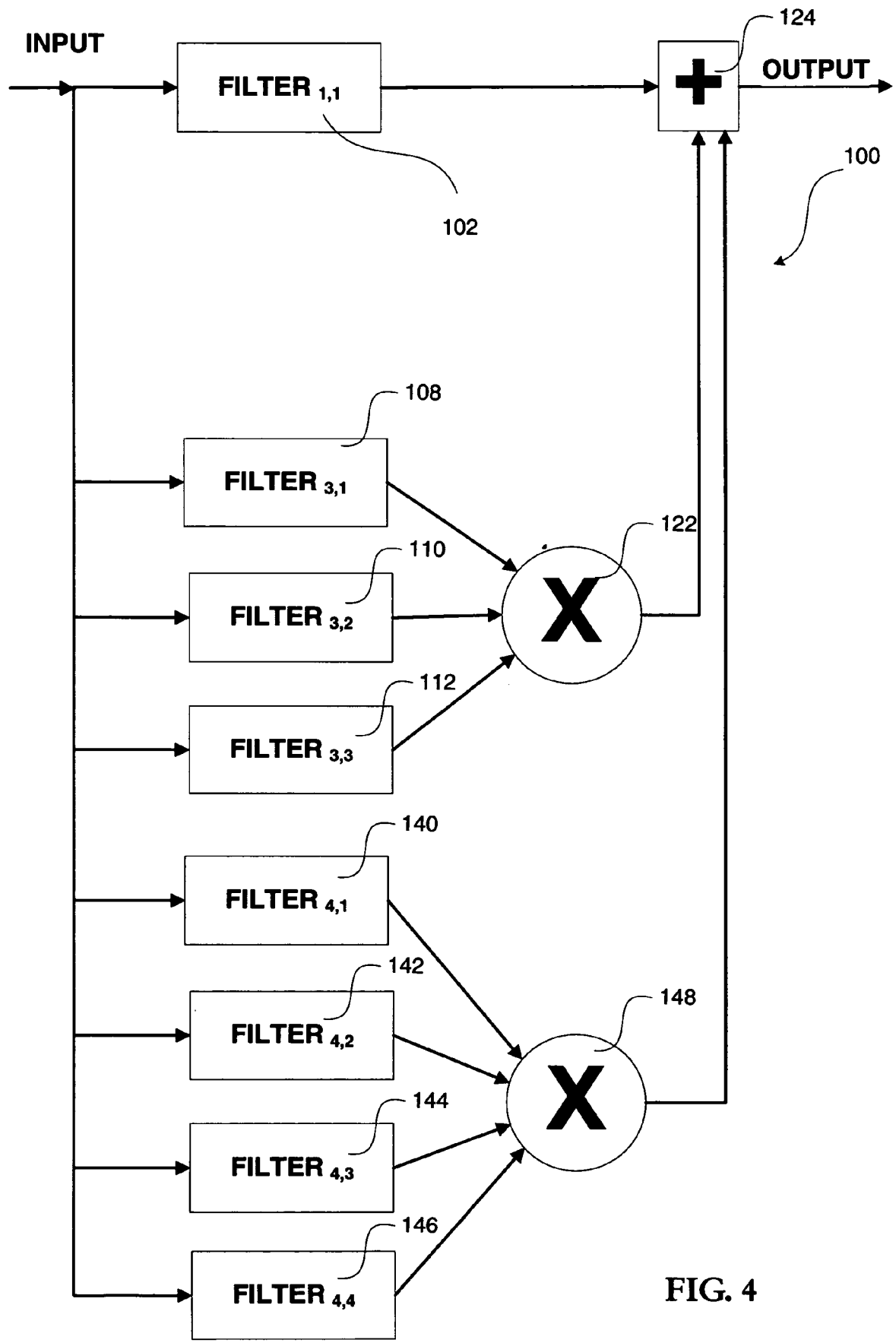
FIG. 4 is a block diagram of a filter product based linearity corrector including compensation for $1^{st}$, $3^{rd}$, and $4^{th}$ order distortions.

As shown in FIG. 4, it is possible to provide an embodiment of the corrector 100 that includes $4^{th}$ order compensation. Taking the general form of Eq. 4, for system order n=4, and ignoring the $h_0$ (DC) term, we get:

$$y(t) = \sum_{i=0}^{N-1} h_{1,1,i}x(t-i) + \left(\sum_{i=0}^{N-1} h_{2,1,i}x(t-i)\right)\left(\sum_{i=0}^{N-1} h_{2,2,i}x(t-i)\right) + \left(\sum_{i=0}^{N-1} h_{3,1,i}x(t-i)\right)\left(\sum_{i=0}^{N-1} h_{3,2,i}x(t-i)\right)\left(\sum_{i=0}^{N-1} h_{3,3,i}x(t-i)\right) + \quad \text{(Eq. 6)}$$

-continued $$\left(\sum_{i=0}^{N-1} h_{4,1,i}x(t-i)\right)\left(\sum_{i=0}^{N-1} h_{4,2,i}x(t-i)\right)$$

$$\left(\sum_{i=0}^{N-1} h_{4,3,i}x(t-i)\right)\left(\sum_{i=0}^{N-1} h_{4,4,i}x(t-i)\right)$$

The $4^{th}$ order terms may be implemented, as shown in FIG. 4, by multiplying filter 140, filter 142, filter 144 and filter 146 together using multiplier 148. Again, this filter product is summed directly to the other order compensation using adder 124, without any intervening filters between the multiplier 148 and the adder 124. As would be clear from the preceding example, one of ordinary skill in the art would be able to solve Eq. 4 to place it in a form similar to that of Eq. 5 and Eq. 6 for any desired order, which could then be implemented using the simple sum of filter products as taught generally herein. As shown in FIG. 4, the $2^{nd}$ order compensation has been removed to allow for calibration as discussed in greater detail below. This configuration would provide compensation in those circumstances where the $4^{th}$ order is of greater importance. Similarly, it would be possible to provide compensation for the $4^{th}$ and $5^{th}$ order and eliminate both the $2^{nd}$ and $3^{rd}$ orders to allow for calibration as discussed below.

The justification for the effectiveness of the proposed decomposition of the general Volterra form, and the corresponding filter product structure, lies in the understanding that a single self-modulation mechanism is present for each product order k, and not in the likelihood that any random Volterra filter system can be decomposed in this way.

The various embodiments of the linearity corrector 100 may be implement using dedicated hardware, such as an FPGA or an ASIC, or using a general purpose processor running software. At the present time, the FPGA or ASIC are useful for performing real-time correction, while software running on a general purpose processor would be useful for post-acquisition correction. In the future, it may be possible to utilize software on a general purpose processor for real-time correction, as well.

Figure 5:
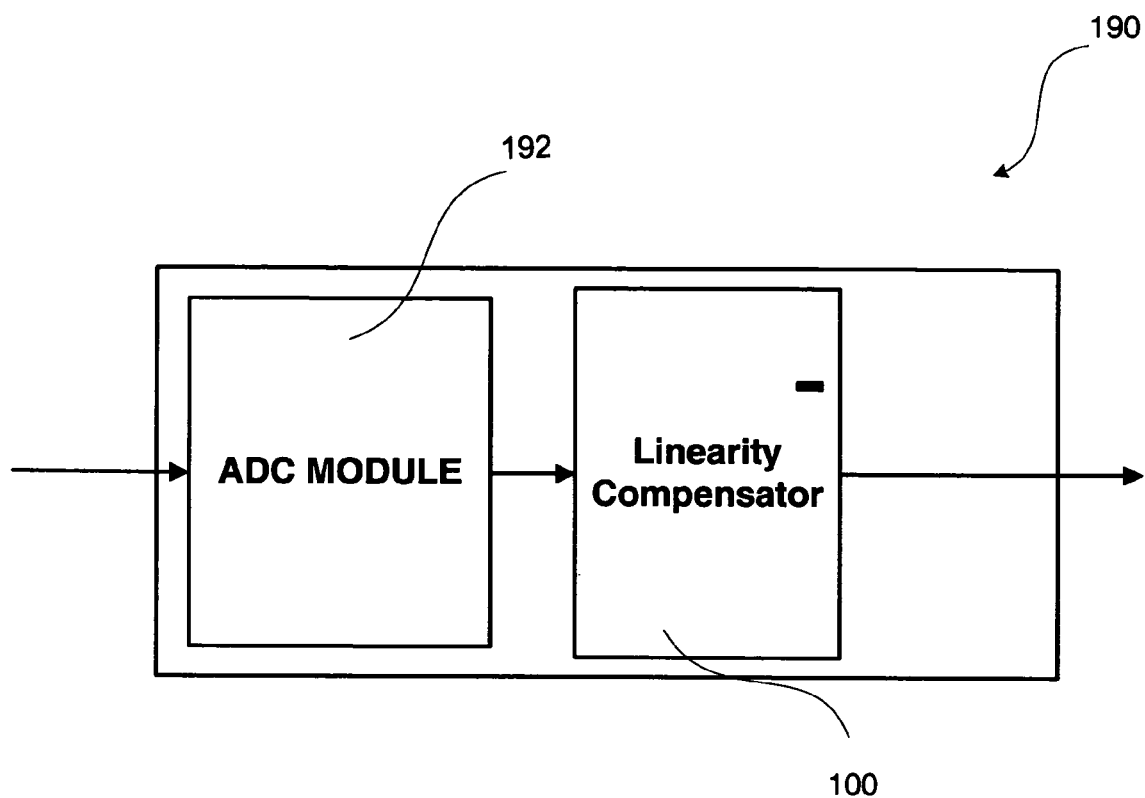
FIG. 5 is a block diagram of a compensated ADC.

Although in some embodiments the linearity corrector 100 is used to compensate a signal output from an ADC, in other embodiments the structure of the linearity corrector 100 may be integrated within the same packing, or possibly on the same chip as the ADC, in order to form a compensated ADC. The compensated ADC 190 is shown in FIG. 5. It comprises the ADC module 192, which contains the various circuits to convert an analog signal into a digital signal. The digital output of the ADC module 192 is input into the linearity corrector 100, which may implemented as taught above. The output of the linearity corrector is a compensated output having reduced distortion. This combined structure provides a compensated ADC.

To properly optimize the linearity correctors described above it will be necessary to calibrate the linearity correctors to determine the appropriate filter coefficients for each of the filters. Unlike the general Volterra filter, the filter product outputs of the correctors shown in FIGS. 2–4 are not linearly related to its coefficients, so computation of the filter coefficients is a nonlinear optimization problem in the general case.

Figure 6:
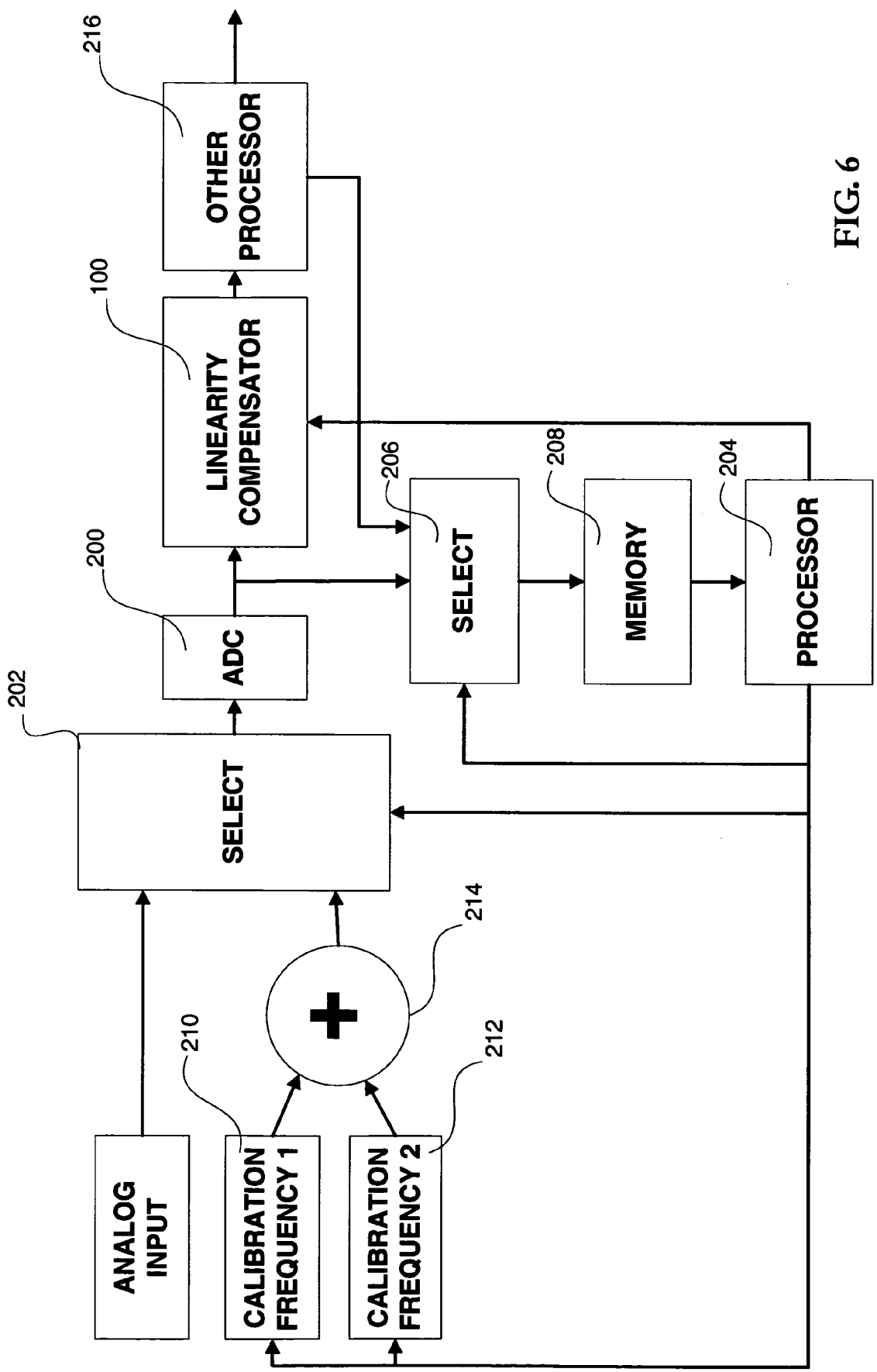
FIG. 6 is a block diagram of an ADC system including compensation and a calibration system.

Accordingly, a linearity corrector system with calibration and a calibration method are proposed. As shown in FIG. 6, an ADC 200 is provided with a linearity corrector 100, and calibration circuitry. An analog select switch 202 is provided to control the input into the ADC. The analog select switch 202 is controlled by a processor 204. During calibration, the processor 204 controls the analog select switch 202 to allow calibration frequency signals into the input of the ADC 200. The processor 204 also controls a digital select switch 206 to control whether the digital output direct from the ADC 200 goes into acquisition memory 208 during calibration. The processor 204 also controls a first calibration frequency generator 210 and a second calibration frequency generator 212. The outputs of the first calibration frequency generator 210 and the second calibration frequency generator 212 are combined in a summing circuit 214 before being input into the ADC 200 during calibration. In an embodiment of the present calibration method, the analog calibration signals and analog summation into the ADC have considerably less distortion than the ADC being calibrated.

During calibration, the acquisition memory 208 acquires uncorrected ADC output for calibration. The data is processed for several acquisitions over a range of pairs of calibration frequencies. The acquired data is processed by the processor 204.

During normal operation, the analog input is fed to the ADC 200 through the analog select switch 202, and the output of the ADC is corrected using the linearity corrector 100. The basic operation of the corrector was described above in connection with FIGS. 2–4. The filters with the linearity corrector can be loaded by the processor 204. A second processor 216 can then be used to provide other processing, for example, it may process the corrected output just as it would with the direct output of the ADC. The embodiment shown in FIG. 6 shows acquisition memory 208 being used for both calibration and other processing. In alternative embodiments, separate memory may be used for other processing. Similarly, the embodiment shown in FIG. 6 shows a second processor 216, in other embodiments the processor 204 may be able to provide this additional processing as well as controlling the calibration process.

Figure 7:
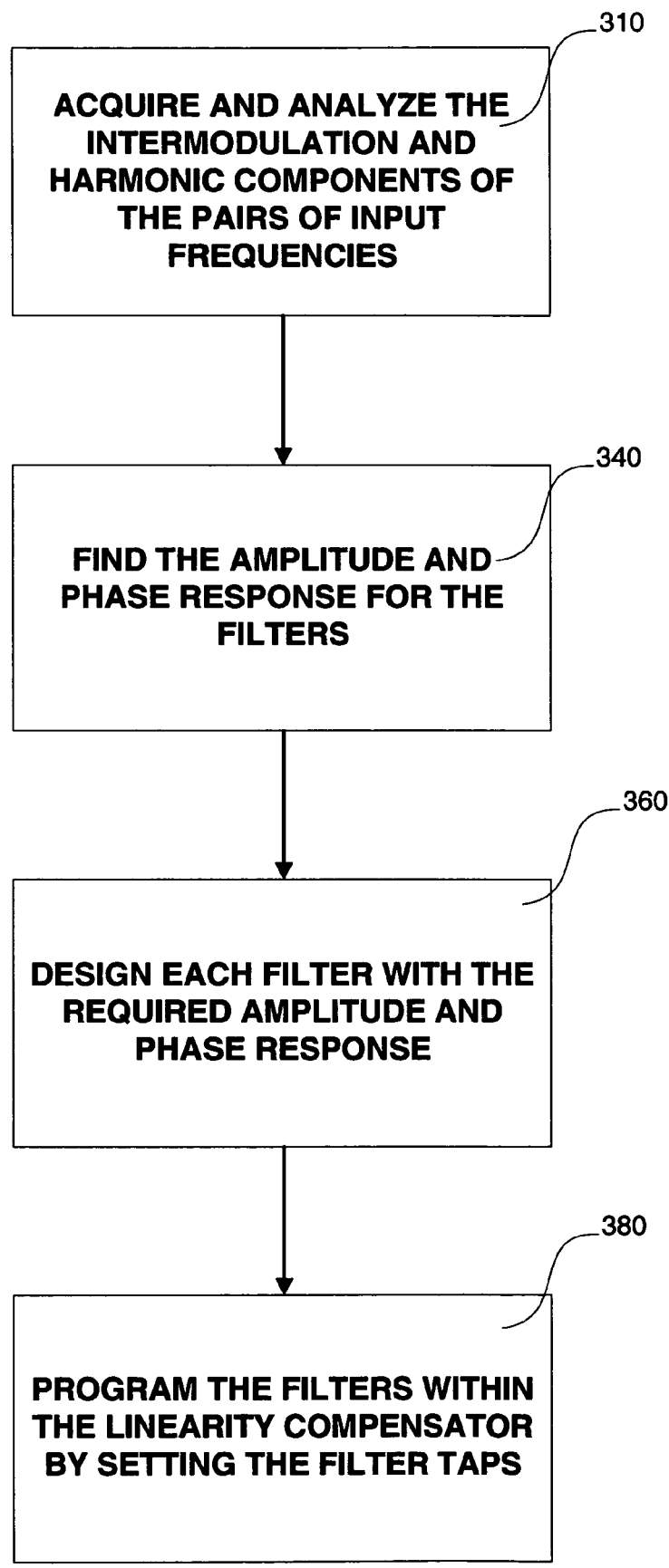
FIG. 7 illustrates the basic calibration process.

As shown in FIG. 7, there are four basic steps to calibrating a set of filters within the filter products in the linearity corrector. For each product order above the $1^{st}$ order, the steps are performed using the product order as a parameter, for example $2^{nd}$ order or $3^{rd}$ order. Step 310 acquires and analyzes the intermodulation (IM) and harmonic components of the pairs of input frequencies. Step 340 uses the results of step 310 to find the amplitude and phase response for the filters in the correction network. Step 360 uses the amplitude and phase responses found in step 340 to design each filter with the required amplitude and phase response using a non-linear phase filter design algorithm. Step 380 programs the filters within the linearity corrector 100 by setting the filter taps to correct for ADC distortion.

Figure 8:
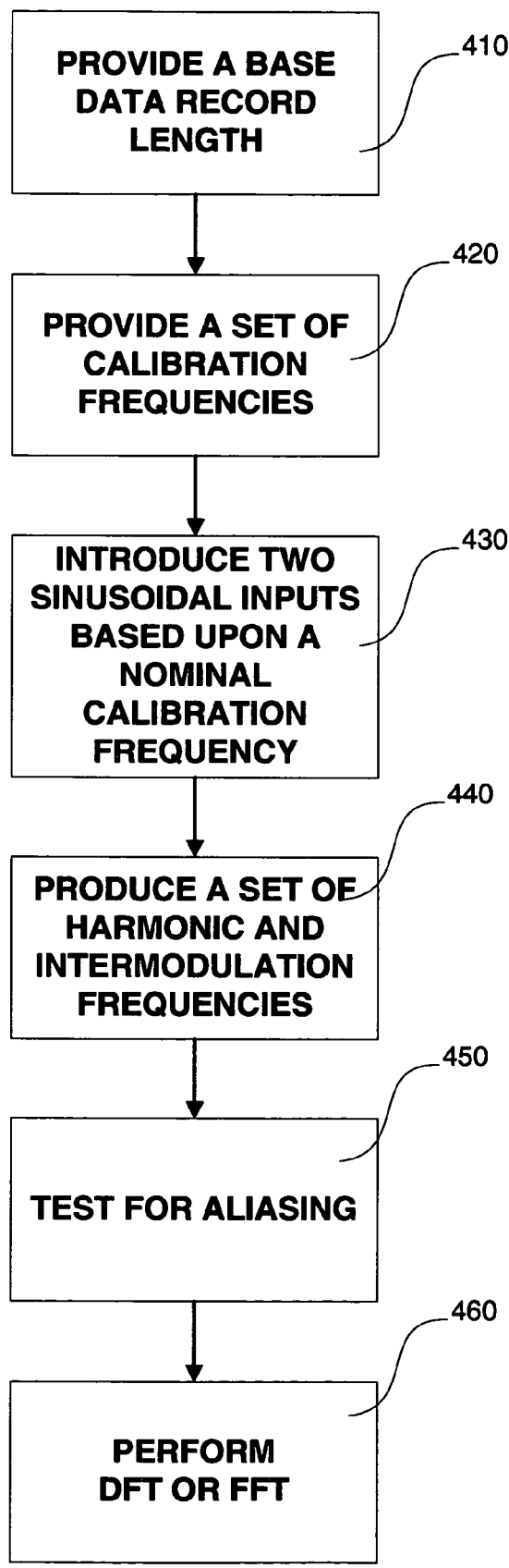
FIG. 8 illustrates additional sub-steps of the calibration process.

The basic signal acquisition and analysis of step 310 may be accomplished by choosing a base data record length as provided in step 410, in FIG. 8. A set of calibration frequencies are chosen in step 420. Step 430 generates two sinusoidal inputs based upon a nominal calibration frequency, and calibration index chosen in step 420. Step 440 calculates a set of harmonic and intermodulation frequencies for each calibration center frequency index. Step 450 tests for aliasing that may cause frequency components to be superimposed. Step 460 performs either i) a set of discrete Fourier transforms (DFTs) at just the calculated harmonic and intermodulation frequencies, or ii) a fast Fourier transform (FFT) that generates results for a complete set of possible frequencies, whereupon the output results at the calculated harmonic and intermodulation frequencies are then selected.

At step 410, a base data record length L for the DFT analysis is chosen. For efficiency, in certain embodiments of the calibration method, L is chosen to be a power of 2. The choice of L corresponds to a fundamental analysis frequency $F=f_s/L$, where $f_s$ is the sample rate. All frequencies $f_m$ are then expressed as harmonics (integer multiples) m of the fundamental analysis frequency F, i.e. $f_m=mF$. Angular frequencies are expressed as:

$$\omega_m = 2\pi f_m = 2\pi mF = 2\pi m f_s/L. \quad \text{(Eq. 7)}$$

At step 420, a set of calibration frequencies is chosen which will be used in subsequent steps to design filter responses. These frequencies are chosen as harmonic multiples of F, and are regularly spaced in the entire Nyquist band in which input frequencies can occur, but always exclude the extremes of 0 (DC), and $f_s/2$.

At step 430, for each calibration index c with nominal calibration frequency $\omega_c$, two sinusoidal inputs are generated with angular frequencies at $\omega_{c-1}=\omega_c-\omega_1$ and $\omega_{c+1}=\omega_c+\omega_1$ which corresponds to:

$$x_c(t) = P_{c-1} \sin(\omega_{c-1}(t+\lambda_{c-1})) + Q_{c+1} \sin(\omega_{c+1}(t+\lambda_{c+1})). \quad \text{(Eq. 8)}$$

where $\lambda_c$ is the delay at frequency index c. In an embodiment of the calibration method, the amplitudes $\{P_{c-1}, Q_{c+1}\}$ are similar to improve IM calibration results. Any minor differences can be removed at a later correction stage. In embodiments of the calibration method, the calibration frequencies are chosen so that they exercise a large proportion of the ADC input dynamic range. An integer multiple M sets of L contiguous A/D output samples is then acquired. Each Mth sample is averaged to obtain a low noise y(t) for t=0 ... L−1, where L is the base data record length provide in step 410 above. This type of simple averaging is very fast, allowing rapid processing for large values of ML (which could be a million samples or more). L should be chosen such that it is not too small or analysis frequencies may be too far apart. Large values of L may generate more calibration frequency data than is needed, causing later algorithms to run more slowly. A value of $L=2^{10}=1024$ has been successfully used.

At step 440, for each calibration center frequency index c (where 0<c<L), a set of harmonic and intermodulation frequencies is produced. DC terms are ignored, because DC errors can occur for many other reasons. For example, the second-order system has IM and harmonic distortion frequencies at: $\{\omega_{c-1}-\omega_{c+1}, 2\omega_{c-1}, \omega_{c-1}+\omega_{c+1}, 2\omega_{c+1},\}$, corresponding to indices: $m=\{2,2c-2,2c,2c+2\}$. In practice, it is possible to calibrate using just the sum-frequency terms, $m=\{2c-2,2c,2c+2\}$. The advantage of using just the frequency sum terms and not difference terms is that the former are not generated by any lower order distorting filter product. This includes the original input signals, which might be called a $1^{st}$ order (linear) "distortion" system.

Note that in a sampled system, IM and harmonic distortion may contain aliased frequency components. Accordingly, at step 450, a test is performed to address situations where aliasing causes frequency components to be superimposed, as the measurements would be inconsistent with the distortion model. For a given c, a set of possible harmonic and IM terms (excluding DC) are generated. In some embodiments, this set will include all possible harmonic and IM terms with the exception of DC terms. For each frequency of index $m_i$ in the list m from step 440, sampling theory cannot distinguish aliased components at frequency intervals of L, so they wrap back on each other as follows:

$$w(m_i) = m_i \bmod L \quad \text{(Eq. 9)}$$

Furthermore, within the wrapped interval L, aliasing cannot distinguish between $w(m_i)$ and $L-w(m_i)$. The aliased index remapping is the lower range interpretation given by:

$$\text{alias}(m_i) = \min(w(m_i), L-w(m_i)) \quad \text{(Eq. 10)}$$

where min( ) is the minimum of its input values. Therefore $0 \leq \text{alias}(m) < L/2$. This remapping of $m_i$ to alias($m_i$) is only used to detect any distortion frequency conflicts for a given integer $m_i$ and L. Conflict detection is most easily achieved by generating all the harmonic and IM frequency indices, and then remapping each frequency index as described in Eq. 9 and Eq. 10 above, and numerically sorting the resulting aliased frequency index values. Adjacent frequency indices with the same remapped frequency index value may then be found. If a conflict is found, no measurements are performed at that value of c. If L is a power of 2, and c is even, then $\{c-1, c+1\}$ are always relatively prime. Conflicts can therefore only occur at aliased frequencies. Even here, conflicts are usually rare. For example, in $3^{rd}$ order systems, a conflict only occurs when $c=L/4$. In this case, the intermodulation component at $2(L/4-1)+(L/4+1)=3L/4-1$ so its aliased frequency is at $L-(3L/4-1)=L/4+1$, which is also an input frequency. Similarly, $(L/4-1)+(2L/4+1)=3L/4+1$, which aliases to $L/4-1$, also an input frequency.

In an embodiment of the present calibration method, a set of L-sample real input DFTs are performed at the selected harmonic and intermodulation frequencies, as indicated at step 460. The real and imaginary components at each frequency m are obtained using a single frequency DFT on the averaged real sample sequence:

$$Z_m = \frac{2}{L} \sum_{t=0}^{L-1} e^{2\pi j m t/L} y(t) \quad \text{(Eq. 11)}$$

$$X_m = \text{Re}(Z_m)$$

$$Y_m = \text{Im}(Z_m)$$

where Re and Im are the real and imaginary parts of a complex input. The form of Eq. 11 is for a normalized sample frequency from Eq. 7 provided in connection with step 410 above. In alternative embodiments, a fast Fourier transform (FFT) may be used instead of multiple DFTs to obtain the real and imaginary components at each frequency m.

In the distorting system, each filter has an unknown amplitude and phase response at this stage. To find these responses, a mathematical model for the distortion of this system is provided. Based upon the model provided, a non-linear optimization can be performed. A self-modulation model for an $N^{th}$-order product represents n unknown filter responses as a modified input to each product term:

$$y_c(t) = \prod_{i=1}^{n} (A_{i,c-1} \cos(\omega_{c-1}(t+\lambda_{i,c-1})) + A_{i,c+1} \cos(\omega_{c+1}(t+\lambda_{i,c+1}))). \quad \text{(Eq. 12)}$$

This self-modulation model can be rewritten in an alternative general form as:

$$y_c(t) = K_c \prod_{i=1}^{n} (\cos(\omega_{c-1}(t + \lambda_{i,c-1})) + B_{i,c+1}\cos(\omega_{c+1}(t + \lambda_{i,c+1}))) \quad \text{(Eq. 13)}$$

where:

$$K_c = \prod_{i=1}^{n} A_{i,c-1} \quad \text{(Eq. 14)}$$

and $$B_{i,c+1} = A_{i,c+1}/A_{i,c-1}. \quad \text{(Eq. 15)}$$

Provided there is a large enough L, if two pairs of frequencies C−1 and C+1 used for calibration are close enough that for a given filter, the delay at each frequency can be assumed to be approximately the same, Eq. 15 can be simplified to:

$$y_c(t) = K_c \prod_{i=1}^{n} (\cos(\omega_{c-1}(t + \lambda_{i,c})) + B_{i,c+1}\cos(\omega_{c+1}(t + \lambda_{i,c}))). \quad \text{(Eq. 16)}$$

The number of variables is equal to 2n+1 for this nth-order distortion system. For each pair of calibration frequencies used, the amplitudes of the sine wave inputs to the ADC are closely matched. Otherwise, the system might not distinguish between differences in their amplitudes, and differences in the amplitude responses of each filter at the two different frequencies.

If the amplitude responses through each filter at the two different calibration frequencies are approximately the same, a simpler self-modulation model can be provided as follows:

$$y_c(t) = K_c \prod_{i=1}^{n} (\cos(\omega_{c-1}(t + \lambda_{i,c})) + \cos(\omega_{c+1}(t + \lambda_{i,c}))) \quad \text{(Eq. 17)}$$

By selecting an ADC that fits one of these distortion models, as represented by Eq. 13, Eq. 16, or Eq. 17, a set of phase and amplitude solutions can be found for each filter path at each frequency. Any of the equations representing the distortion models can be expanded to provide a set of intermodulation and harmonic frequency components corresponding to those found above at with step 440. The reduction can be expressed as a cosine (real) and sine (imaginary term at each frequency. Once expansion and collection of frequency terms is obtained, along with the set of DFTs determined at step 460, then the sum of the squares of the differences between the real and imaginary parts of these expressions and the DFT results, which may have been obtained from DFTs or FFTs as described above, can be obtained symbolically. This results in a large equation for $2^{nd}$ order distortion, and even larger equations for each higher order.

Since phase $\phi$ and delay $\lambda$ are related at an angular frequency $\omega$ by:

$$\lambda = \phi/\omega, \quad \text{(Eq. 18)}$$

substituting $\omega_m$ from Eq. 7, and using a normalized frequency (i.e. $f_s$=1) allows any of the model equations Eq. 13, Eq. 16, or Eq. 17 to be rewritten in terms of frequency indices. For example, Eq. 16 may be rewritten as:

$$y_c(t) = K_c \prod_{i=1}^{n} \left(\cos\left(\frac{2\pi(c-1)(t + \lambda_{i,c})}{L}\right) + B_{i,c+1}\cos\left(\frac{2\pi(c+1)(t + \lambda_{i,c})}{L}\right)\right) \quad \text{(Eq. 19)}$$

For an example of decomposition into real and imaginary parts with order n=2, we expand Eq. 19 and collect terms to get terms at the four non-DC intermodulation and harmonic frequency indices: {2, 2c, 2c−2, 2c+2}:

$$y_{2,c}(t) = C_{2,c}\cos\left(\frac{2\pi(2)t}{L}\right) + S_{2,c}\sin\left(\frac{2\pi(2)t}{L}\right) \quad \text{(Eq. 20)}$$

$$y_{2c,c}(t) = C_{2c,c}\cos\left(\frac{2\pi(2c)t}{L}\right) + S_{2c,c}\sin\left(\frac{2\pi(2c)t}{L}\right) \quad \text{(Eq. 21)}$$

$$y_{2c-2,c}(t) = C_{2c-2,c}\cos\left(\frac{2\pi(2c-2)t}{L}\right) + S_{2c-2,c}\sin\left(\frac{2\pi(2c-2)t}{L}\right) \quad \text{(Eq. 22)}$$

$$y_{2c+2,c}(t) = C_{2c+2,c}\cos\left(\frac{2\pi(2c+2)t}{L}\right) + S_{2c+2,c}\sin\left(\frac{2\pi(2c+2)t}{L}\right) \quad \text{(Eq. 23)}$$

where the set of coefficients {C,S} are found to be:

for Eq. 20:

$$C_{2,c} = \frac{K_c}{2}\left(B_{1,c+1}\cos\left(\frac{2\pi(c(\lambda_{1,c} - \lambda_{2,c}) + \lambda_{1,c} + \lambda_{2,c})}{L}\right) + B_{2,c+1}\cos\left(\frac{2\pi(c(\lambda_{1,c} - \lambda_{2,c}) - \lambda_{1,c} - \lambda_{2,c})}{L}\right)\right)$$

$$S_{2,c} = \frac{K_c}{2}\left(B_{1,c+1}\sin\left(\frac{2\pi(c(\lambda_{1,c} - \lambda_{2,c}) + \lambda_{1,c} + \lambda_{2,c})}{L}\right) - B_{2,c+1}\sin\left(\frac{2\pi(c(\lambda_{1,c} - \lambda_{2,c}) - \lambda_{1,c} - \lambda_{2,c})}{L}\right)\right)$$

for Eq. 21:

$$C_{2c,c} = \frac{K_c}{2}\left(B_{1,c+1}\cos\left(\frac{2\pi(c(\lambda_{1,c} + \lambda_{2,c}) + \lambda_{1,c} - \lambda_{2,c})}{L}\right) + B_{2,c+1}\cos\left(\frac{2\pi(c(\lambda_{1,c} + \lambda_{2,c}) - \lambda_{1,c} + \lambda_{2,c})}{L}\right)\right)$$

$$S_{2c,c} = \frac{K_c}{2}\left(B_{1,c+1}\sin\left(\frac{2\pi(c(\lambda_{1,c} + \lambda_{2,c}) + \lambda_{1,c} - \lambda_{2,c})}{L}\right) + B_{2,c+1}\sin\left(\frac{2\pi(c(\lambda_{1,c} + \lambda_{2,c}) - \lambda_{1,c} + \lambda_{2,c})}{L}\right)\right)$$

for Eq. 22:

$$C_{2c-2,c} = \frac{K_c}{2}\cos\left(\frac{2\pi(c-1)(\lambda_{1,c} + \lambda_{2,c})}{L}\right)$$

$$S_{2c-2,c} = \frac{K_c}{2}\sin\left(\frac{2\pi(c-1)(\lambda_{1,c} + \lambda_{2,c})}{L}\right)$$

for Eq. 23:

$$C_{2c+2,c} = \frac{K_c}{2}B_{1,c+1}B_{2,c+1}\cos\left(\frac{2\pi(c+1)(\lambda_{1,c} + \lambda_{2,c})}{L}\right)$$

$$S_{2c+2,c} = \frac{K_c}{2}B_{1,c+1}B_{2,c+1}\sin\left(\frac{2\pi(c+1)(\lambda_{1,c} + \lambda_{2,c})}{L}\right)$$

Now the sum of squares of the differences between these coefficients and their corresponding DFT, or FFT, components from Eq. 11 are evaluated:

$$e_{2,c}(x) = \sum_{m=\{2,2c,2c-2,2c+2\}} ((C_{m,c} - X_m)^2 + (S_{m,c} - Y_m)^2) \quad \text{(Eq. 24)}$$

Eq. 24 may be referred to here in, as the objective function or the error. For the $2^{nd}$ order case, the unknowns to be found may be represented by the vector:

$$x_c = \{K_c, B_{1,c+1}, B_{2,c+1}, \lambda_{1,c}, \lambda_{2,c}\} \quad \text{(Eq. 25)}$$

Figure 9:
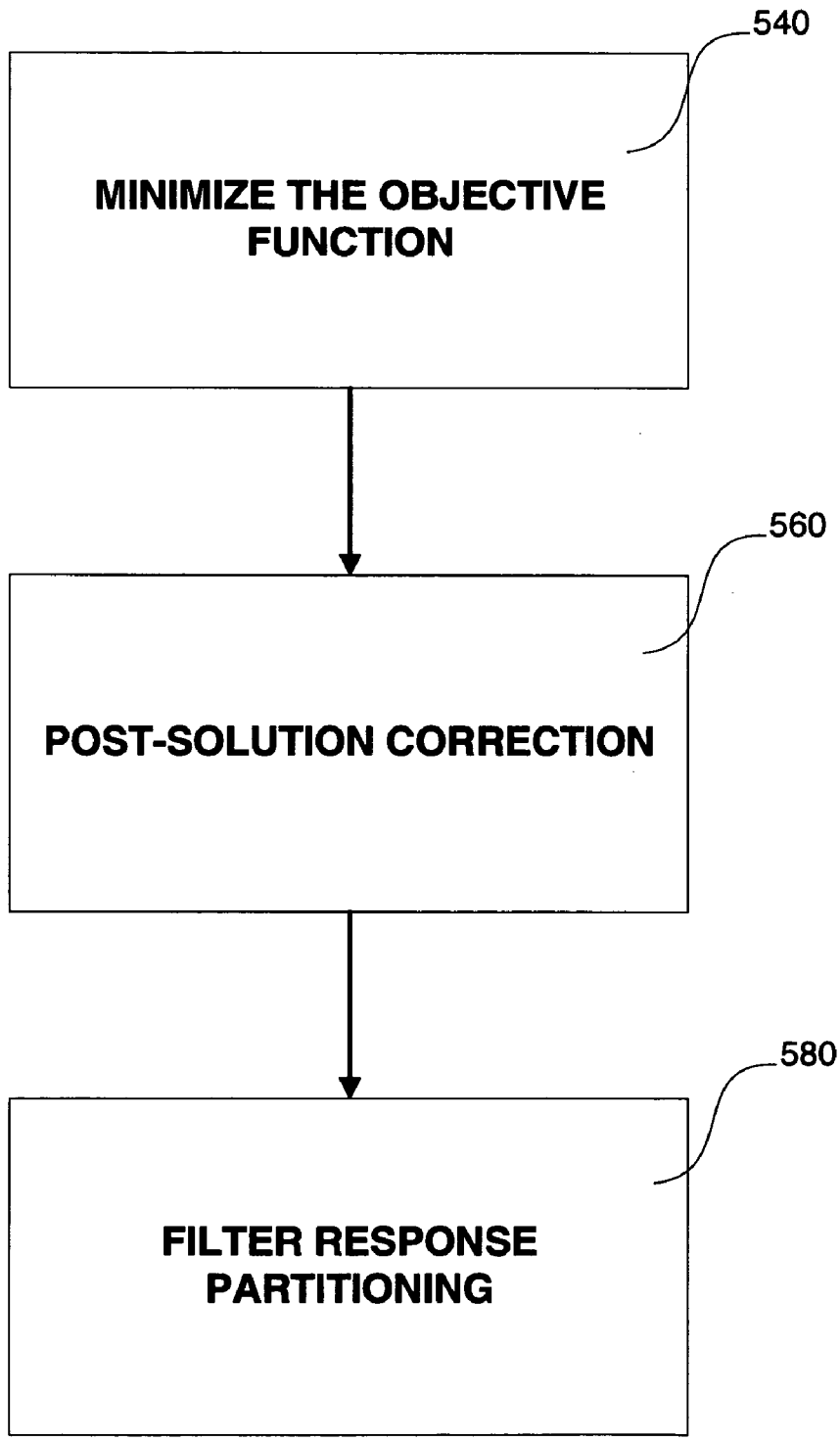
FIG. 9 illustrates additional sub-steps of the calibration process.

Once the objective function has been provided, the amplitude and phase response for each filter can be determined. Referring now to FIG. 9, an embodiment of the present calibration method is shown. As provided in step 540, first the objective function will be minimized. After the objective function is minimized, post-solution correction of the amplitudes is performed, as shown at step 560. The correct solution is now partitioned between the filters provided for each order, as indicated at step 580.

$$\nabla e_{2,c}(x) = \begin{pmatrix} \frac{\partial e_{2,c}(x)}{\partial K_c} \\ \frac{\partial e_{2,c}(x)}{\partial B_{1,c+1}} \\ \frac{\partial e_{2,c}(x)}{\partial B_{2,c+1}} \\ \frac{\partial e_{2,c}(x)}{\partial \lambda_{1,c}} \\ \frac{\partial e_{2,c}(x)}{\partial \lambda_{2,c}} \end{pmatrix}$$

The (ij)th element of a Hessian matrix is the partial derivative of the objective function with respect to its ith and jth variables. Again, for the $2^{nd}$ order case the Hessian matrix is given by:

$$\nabla^2 e_{2,c}(x) = \begin{pmatrix} \frac{\partial^2 e_{2,c}(x)}{\partial K_c \partial K_c} & \frac{\partial^2 e_{2,c}(x)}{\partial K_c \partial B_{1,c+1}} & \frac{\partial^2 e_{2,c}(x)}{\partial K_c \partial B_{2,c+1}} & \frac{\partial^2 e_{2,c}(x)}{\partial K_c \partial \lambda_{1,c}} & \frac{\partial^2 e_{2,c}(x)}{\partial K_c \partial \lambda_{2,c}} \\ \frac{\partial^2 e_{2,c}(x)}{\partial B_{1,c+1} \partial K_c} & \frac{\partial^2 e_{2,c}(x)}{\partial B_{1,c+1} \partial B_{1,c+1}} & \frac{\partial^2 e_{2,c}(x)}{\partial B_{1,c+1} \partial B_{2,c+1}} & \frac{\partial^2 e_{2,c}(x)}{\partial B_{1,c+1} \partial \lambda_{1,c}} & \frac{\partial^2 e_{2,c}(x)}{\partial B_{1,c+1} \partial \lambda_{2,c}} \\ \frac{\partial^2 e_{2,c}(x)}{\partial B_{2,c+1} \partial K_c} & \frac{\partial^2 e_{2,c}(x)}{\partial B_{2,c+1} \partial B_{1,c+1}} & \frac{\partial^2 e_{2,c}(x)}{\partial B_{2,c+1} \partial B_{2,c+1}} & \frac{\partial^2 e_{2,c}(x)}{\partial B_{2,c+1} \partial \lambda_{1,c}} & \frac{\partial^2 e_{2,c}(x)}{\partial B_{2,c+1} \partial \lambda_{2,c}} \\ \frac{\partial^2 e_{2,c}(x)}{\partial \lambda_{1,c} \partial K_c} & \frac{\partial^2 e_{2,c}(x)}{\partial \lambda_{1,c} \partial B_{1,c+1}} & \frac{\partial^2 e_{2,c}(x)}{\partial \lambda_{1,c} \partial B_{2,c+1}} & \frac{\partial^2 e_{2,c}(x)}{\partial \lambda_{1,c} \partial \lambda_{1,c}} & \frac{\partial^2 e_{2,c}(x)}{\partial \lambda_{1,c} \partial \lambda_{2,c}} \\ \frac{\partial^2 e_{2,c}(x)}{\partial \lambda_{2,c} \partial K_c} & \frac{\partial^2 e_{2,c}(x)}{\partial \lambda_{2,c} \partial B_{1,c+1}} & \frac{\partial^2 e_{2,c}(x)}{\partial \lambda_{2,c} \partial B_{2,c+1}} & \frac{\partial^2 e_{2,c}(x)}{\partial \lambda_{2,c} \partial \lambda_{1,c}} & \frac{\partial^2 e_{2,c}(x)}{\partial \lambda_{2,c} \partial \lambda_{2,c}} \end{pmatrix}$$

To minimize the objective function, as provided at step 540, a system of nonlinear equations will need to be solved. A class of Newton-based algorithms may be used to solve these nonlinear equations and minimize the objective function for each desired order. Possible Newton-based algorithms include the modified-Newton (MN), the Gauss-Newton (GN), and the Quasi-Newton (QN). At each search iteration k, these methods all evaluate a numeric Gradient vector ($g_k$) of the objective function, and a numeric inverse of the Hessian ($S_k$) of the objective function, or an approximation to the inverse of the Hessian function of the objective function for the GN and QN methods. The Gradient vector of the objective function and the inverse of the Hessian of the objective function may be described as follows:

$$g_k = \nabla e_{2,c}(x) \text{ at } x = x_k \quad \text{(Eq. 26)}$$

$$S_k = (\nabla^2 e_{2,c}(x))^{-1} \text{ at } x = x_k \quad \text{(Eq. 27)}$$

By evaluating the Gradient vector and the inverse Hessian it is possible to obtain a search direction ($d_k$) that may be used to minimize the objective function, where the search direction is given by:

$$d_k = -S_k g_k \quad \text{(Eq. 28)}$$

The Gradient vector of the objective function $\nabla e_{2,c}(x)$ is defined as a vector whose ith component is the partial derivative of the function with respect to its ith unknown variable. It is therefore a symbolic result at this stage, not numeric. For the second order case corresponding the Eq. 16 with 5 unknowns, and the objective function provided by Eq. 24:

The matrix elements are therefore in terms of the unknown variables in x. The partial derivative operator is commutative, so Hessian matrixes are always square-symmetric.

The corresponding Gradient and Hessian matrices can be found for the objective function. Although finding derivatives of such complex expressions is very tedious to do, computerized symbolic calculations can be performed using symbolic mathematical software tools such as the symbolic derivative function in Mathematica. Alternatively, the derivative f'(x) of any function f(x) can be found numerically using the well known approximation:

$$f'(x) \approx \frac{f(x + \Delta) - f(x)}{\Delta} \quad \text{(Eq. 29)}$$

for a suitably small value of $\Delta$ given the computing precision available. Either symbolic or numeric differentiation can be used. Symbolic differentiation may be provided by symbolic mathematical software, and this processing provided by such software uses a general purpose processor for processor 204. Note that if a symbolic differentiation has been obtained, in some embodiments of the present calibration method these symbolic results may be coded as a function using a lower level language, such as C, in order to improve the performance of this operation within the processor 204. In alternative embodiments, numeric differentiation may be used by the processor instead of providing a coding implementation of the symbolic solutions.

As discussed above the inverse Hessian can be solved using a Newton-based algorithm either directly, or iteratively. For example, in an embodiment of the present calibration method, a Quasi-Newton algorithm is used to iteratively determine an approximation to the inverse of the Hessian matrix. There are several sub-categories of QN iterations that may be used. For example, the BFGS (Broyden, Fletcher, Goldfarb, Shanno) iteration formula may be used. In an embodiment of the present calibration method, the BFGS iteration formula is used together with Fletcher's Line Search algorithm. The (k+1)th BFGS iteration of the inverse Hessian $S_{k+1}$ is given by:

$$S_{k+1} = S_k + \frac{(q_k + \gamma_k^T p_k)\delta_k \delta_k^T}{(q_k)^2} - \frac{(r_k + r_k^T)}{q_k} \quad \text{(Eq. 30)}$$

where the column vector $p_k$, scalar $q_k$, and square matrix $r_k$ are given by:

$$p_k = S_k \gamma_k \quad \text{(Eq. 31)}$$
$$q_k = \delta_k^T \gamma_k$$
$$r_k = p_k \delta_k^T = S_k \gamma_k \delta_k^T$$

$S_k$ (a square matrix) is the kth approximation to the inverse Hessian, and $S_0=I$ the identity matrix. Note that superscript T is the transpose, e.g.: $\delta_k^T$ is the transpose of $\delta_k$. Also the column vector:

$$\gamma_k = g_{k+1} - g_k \quad \text{(Eq. 32)}$$

where $g_k$ is the gradient vector obtained earlier from (Eq. 26). The new solution vector estimate $x_{k+1}$ for the next iteration is given by a correction column vector $\delta_k$ applied to the previous $x_k$:

$$x_{k+1} = x_k + \delta_k \quad \text{(Eq. 33)}$$

To find the unknown $\delta_k$ for each iteration, a constrained search along the search direction $d_k$ is used. Once $x_k$ is found using Eq. 33 and $d_k$ is found using Eq. 28 and Eq. 30, then a non-negative scalar $\alpha_k$ is found that minimizes $$e_2(x_{k+1}) = e_2(x_k + \delta_k) = e_2(x_k + \alpha_k d_k) \quad \text{(Eq. 34)}$$

This is a 1-dimensional optimization problem in $\alpha_k$, regardless of the dimensions of the original problem. Solving this particular type of equation is therefore known as a line search.

The current solution estimates vector $x_k$ and its corresponding search direction $d_k$ are given as input to the Fletcher Line Search algorithm to give a scalar value $\alpha_k$. The column vector correction to $x_k$ in Eq. 33, is then given by:

$$\delta_k = x_{k+1} - x_k = \alpha_k d_k \quad \text{(Eq. 35)}$$

Finding a global minimum of an objective function is known to be a difficult problem in the general case. The minimum found always depends on the objective function, but it may also depend upon the starting conditions $x_0$. If the distortion model is a reasonably good fit, then convergence is generally fast and reliable. However, if the real distortion mechanism consists of multiple distortion products or some other mechanism that does not follow the distortion model, then the solution may diverge. In this case, progress towards a solution is made, and the error function Eq. 24 is reducing on each iteration, but one of the unknowns in the vector x is exponentially diverging towards infinity. A limit on the number of BFGS iterations can reliably detect this type of problem. However, the process of reaching this limit also slows down the calibration algorithm.

If after noise reduction averaging, divergence is seen, then a divergence failure flag may be set to indicate the need for further diagnostics, or failure of the ADC.

However, once a minimum solution is approached, algorithm convergence is quadratic, so it rapidly converges to a repeatable result. This property may be used to explore the solution space for the model of Eq. 16. If a solution converges on a solution that was previous found, it can be rejected as a duplicate solution. The process may continue until a statistically satisfactory determination that no more minima can be found has been achieved.

In some embodiments of the present calibration method, there may be other nearby solutions at angles with near integer multiples of π. These repeated solutions can also be identified and eliminated as trivially related or "uninteresting".

One approach to finding solutions is to start x at random values of B in Eq. 19, using:

$$B = e^{u(Random-1/2)} \quad \text{(Eq. 36)}$$

Random is a random real value from 0 to 1. A value of u=0.1 works quite well on real ADC data. Angles φ can each be randomly generated in the range:

$$-\pi \leq \phi < \pi \quad \text{(Eq. 37)}$$

and then angles can be translated to delays in Eq. 19 at known frequencies using Eq. 18.

In another embodiment, a solution for a known ADC design is found by restricting the initial range of random angles that are used as a function of calibration index c to a range that has worked during previous calibrations. This restriction of the initial range may speed up the search for solutions.

Even though the starting values are at least constrained by Eq. 37, the final values may lie outside these ranges into the nearest neighboring repeated solutions. This is because the starting point may lie on the other side of a repeated "hump" between the repeated minima. However, even further out repeated solutions are not found because of the similarity in the repeated function "landscapes" over the interval π. In an embodiment of the present calibration method, the nearest neighboring solutions are found and repeated solutions are eliminated.

For each calibration frequency, once a first solution angle is found, then a central solution (i.e. with angle nearest 0) can be easily found. In an embodiment of the present calibration method, the angle found is directly verified as a central solution (within ±π/2). In an alternative embodiment, the nearest integer multiples of π from the central solution region is found using multiple=floor(angle/π+0.5), and then this multiple of π is subtracted from the first solution angle to bring the angle into the central region. In some applications, solutions near ±π/2 may fluctuate with noise between +π/2 or −π/2 in otherwise smooth variations of angles with calibration frequency. These fluctuations can be corrected by looking for angle continuity later in the processing. A second run of the BFGS algorithm can then quickly find a more accurate central solution by using the displaced first solution as a good starting point.

From the central solution, the nearest neighboring solutions from the central solution can be found systematically.

As with finding the central solution above, the repeat solutions can be found by adding all combinations of $\{-\pi,0,\pi\}$ to each angle, and using the resulting vector as a starting point for a BFGS solution search. Again, because each starting point is very close to the correct value, the BFGS algorithm converges very rapidly. There are $3^2-1=8$ neighboring solutions for $2^{nd}$ order searches, and $3^3-1=26$ neighbors for $3^{rd}$ order searches.

After these solutions are found, searches at other random start positions can be used to find any further solutions, if they exist. If a solution matches one of the previously found solutions, it is rejected. As discussed earlier, the process of verifying a duplicate is made simpler by the high repeatability of the solutions found by the BFGS algorithm with symbolic gradients.

If a new solution does not match those found so far, then its central solution can be found, and all its neighboring solutions found using the same method as described previously. In an embodiment of the present calibration method, a fruitful search outcome resets a timeout counter, while a failure to find a new solution decrements the timeout counter. If the timeout reaches zero, then it stops searching for further solutions. The central solution that gives the best error measure according to Eq. 24 is selected as the final solution for that calibration frequency index.

In an embodiment of the present calibration method, if a solution has been found at a previous calibration frequency index $c_{prev}$, then it can be used as the starting point for the next search at c. If it fails to converge, the previously described slow random search approach is used.

If no solutions can be found for a particular c, a second pass can use solutions at $c_{next}$ as starting points. If still no solution is found, then patching or interpolation between neighbors can be used. If no solutions can be found for too many calibration value indices, then the ADC is defective, and a defective flag may be set.

If an acceptable set of solutions for all calibration frequencies have been found, the amplitude and phase response of each path into the product of the self-modulating system has been characterized at the set of chosen discrete calibration frequencies. With a uniform spread of these frequencies, a response for each path can be represented by the FIR filters as in FIG. 2–4. In an embodiment of the present calibration method, the coefficients for each filter are now found iteratively.

In another embodiment of the present calibration method, corrections are made to the set of vectors $x_c$ from Eq. 25 before passing them on to the filter design, as provided at step 560. In embodiments of the present calibration method, the amplitudes of the calibration inputs will not significantly affect the filter responses over a reasonable calibration range. From Eq. 14 it is apparent that this dependency is removed by dividing $K_c$ through by $P_{c-1}{}^n$ where n is the product order index. Furthermore, in some embodiments, any differences in the amplitude of the two calibration sine inputs of Eq. 8 should also have a negligible affect on the filter responses. In this case, not only the relative responses of the distorting filters, but also the relative amplitudes of the calibration sine inputs may affect the measured results. Accordingly, in these embodiments a correction is performed using the relative amplitudes of $P_{c-1}$ and $Q_{c+1}$. The ratio:

$$R_c = Q_{c+1}/P_{c-1} \qquad \text{(Eq. 38)}$$

gives the amount that the B parameters in x are overestimated. Therefore the parameters of x in Eq. 25 are corrected for a nth-order calibration to give the new vector $X_c$ as:

$$X_c = \{K_c/P_{c-1}{}^n, B_{1,c+1}/R_c, B_{2,c+1}/R_c, \lambda_{1,c}, \lambda_{2,c}\} \qquad \text{(Eq. 39)}$$

At any calibration frequency, the combined amplitude response of a filter product system is a function of the amplitude responses of each filter. Therefore we can make the coefficients of one filter twice as large, and another twice as small, and have the same result. The variations in system amplitude response can be considerable between calibration frequencies. We can spread the burden of tracking amplitude response variations equally amongst all the filters in a filter-product system by making each filter within a product have an identical 1/nth root response for an nth-order distortion correction system from the first term in Eq. 39 such that:

$$\text{Ampl}_c = (K_c/P_{c-1}{}^n)^{1/n} = K_c{}^{1/n}/P_{c-1} \qquad \text{(Eq. 40)}$$

For an nth order distortion system, there are n pairs of amplitude and frequency responses in each vector $X_c$ at frequency index c. Arbitrarily assigning each pair of amplitude and phase response to one of n filters is likely to result in a non-smooth amplitude response, phase response, or both for each filter as a function of frequency. Non-smooth responses may produce filter designs that fail to track the desired responses well for the filter lengths chosen. Accordingly, the amplitude response and phase response are partitioned between available filters for each order, as indicated at step 580. Since a sufficiently dense set of calibration frequencies generally results in a high degree of correlation between delay responses for adjacent calibration indices, in an embodiment of the present calibration method a better fit between a new set of delays and a previous set of delays is achieved by testing possible permutations of the new set against the previous set at frequency index $c_{prev}$, modulo half the calibration cycle period ($1/f_{c-1}$). In the case of an odd number of slips, a delay corresponding to half cycle is applied to one of the filters. In embodiments of the present calibration method, for example an embodiment employing the model described by Eq. 16, each phase value has a corresponding amplitude, so reordering phases also reorders corresponding amplitudes. If two phases cross over, they may be grouped as a minimum phase value for one filter and a maximum phase value for the other filter. The resulting kink in each phase plot is not as detrimental to the quality of the resulting filters as a discontinuity, and produces viable filter designs, if enough filter taps are provided.

Figure 10:
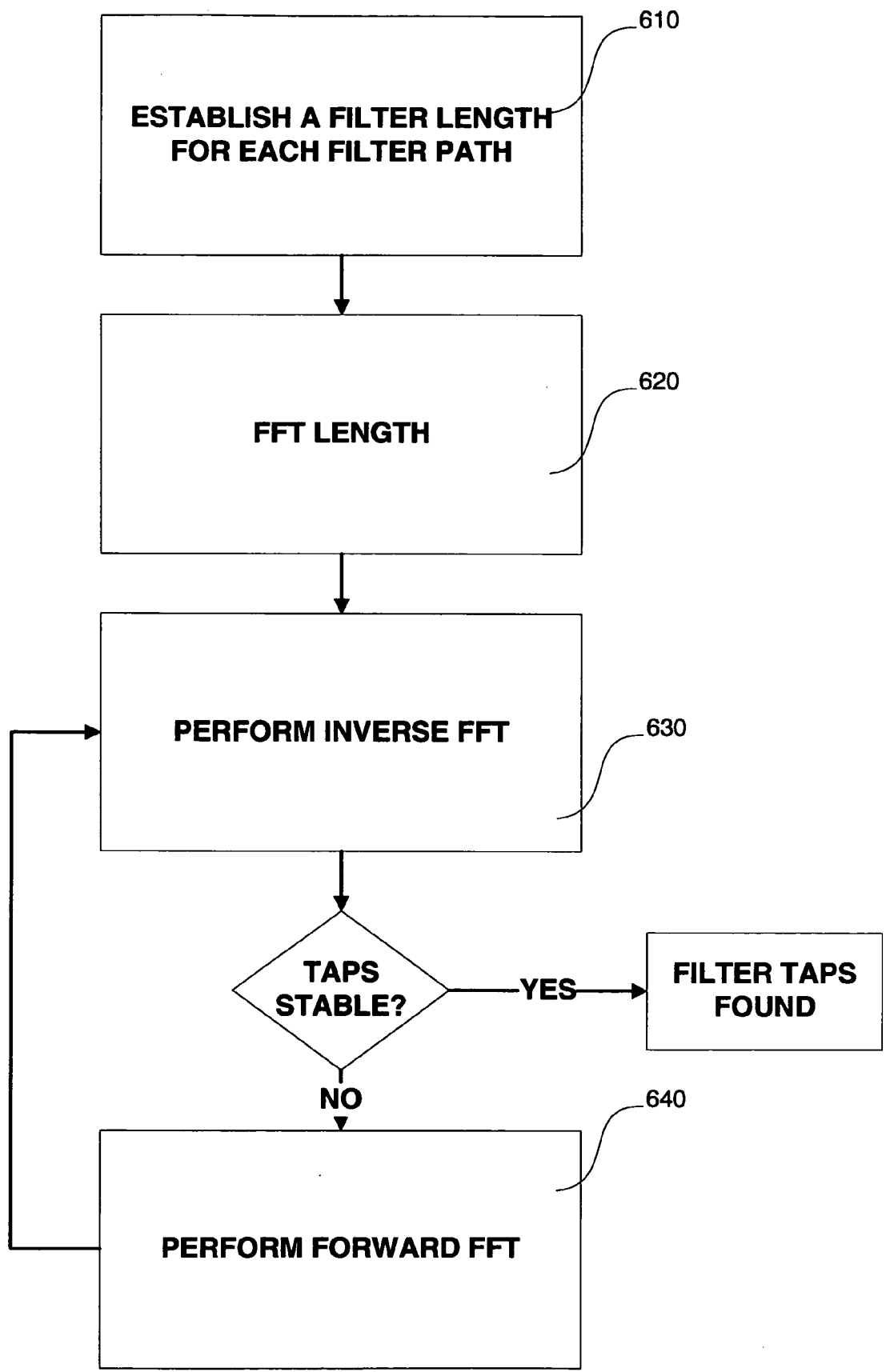
FIG. 10 illustrates additional sub-steps of the calibration process.

From the previous calibration steps, a set of properly grouped amplitude and phase responses is obtained for each filter path. The filter design step 360, in FIG. 6, uses the amplitude and phase responses calculated in step 340 to design each filter to give an approximation to the calculated responses. In the case of radio-frequency (RF) applications, the middle portion of an upper-Nyquist band of the ADC is used, leaving the outer frequency regions uncalibrated in that band. This implies that the outer frequencies are unconstrained. As shown in FIG. 10, in embodiments of the present calibration method an iterative process is used to complete the filter design and find the filter taps. In alternative embodiments, a simple inverse FFT may be used.

A filter length is chosen for each path, as shown at step 610. In an embodiment of the present calibration method, the same filter length is used for all paths. In alternative embodiments, different filter lengths are used for some or all paths. In this alternative embodiment, additional delays may be required to compensate for the different filter lengths. The filter length may depend, at least in part, on the desired performance and the ADC that is to be calibrated. By way of example, filter lengths all of 63 taps, or filter lengths all of 127 taps, have been used.

At step 620, an FFT length is selected and the amplitude and phase responses are converted to a filter frequency response vector of complex rectangular coordinates. The FFT length should be longer than the filter length chosen in step 610. For example, in an embodiment of the present calibration method a real FFT length of 512 samples was selected. Since the FFT is longer than the filter length, the values outside the frequencies corresponding to the filter taps are initialized to zero here.

At step 630, an inverse FFT of the filter frequency response vector is performed to obtain a set of real filter taps, but with taps extending to the FFT length, for example 512. In the time domain, the taps beyond the chosen filter length are forced to zero.

At step 640, a forward FFT is performed to return to the frequency domain. Some region of the frequency response vector should be unconstrained. The FFT bins in the frequencies of interest are overwritten back to the original values for the desired amplitude and frequency responses, leaving the unconstrained frequency bins unchanged.

Steps 630 and 640 are repeated to iteratively converge on a desired solution. Once the filter taps provided at step 630 have stabilized from previous iterations, the filter taps have been found.

Once the filter taps have been obtained from step 630, the hardware can be programmed as provided at step 380 in FIG. 3. The programmed filter product system is now capable of correcting for ADC harmonic and intermodulation distortion.

It will be obvious to those having skill in the art that many changes may be made to the details of the above-described embodiments of this invention without departing from the underlying principles thereof. The scope of the present invention should, therefore, be determined by the following claims.

What is claimed is:

1. A calibration system comprising:
    a first analog signal generator producing a first analog signal;
    a second analog signal generator producing a second analog signal;
    an analog adder connected to the first analog signal generator and the second analog signal generator for adding the first analog signal and the second analog signal and providing an analog output;
    an ADC having an input connected to the analog output and a digital output;
    a linearity corrector implementing a sum of filter products having an input connected to the digital output;
    an acquisition memory connected to the digital output; and
    a processor for controlling the first signal generator and the second signal generator and connected to read the acquisition memory data and also connected to the linearity corrector to program filter coefficients for the filter products.

2. The calibration system of claim 1, wherein the first signal generator produces a first sine wave and the second signal generator produces a second sine wave.

3. The calibration system of claim 2, wherein the first sine wave and the second sine wave have frequencies that are relatively prime multiples of a frequency corresponding to an analysis length.

4. The calibration system of claim 3, wherein a nominal frequency index is provided that is an even multiple of the frequency corresponding to the analysis length, and the first sine wave corresponds to the nominal frequency index minus one, and the second sine wave corresponds to the nominal frequency index plus one.

5. The calibration system of claim 1, wherein the processor comprises dedicated circuitry for finding an objective function minima.

6. The calibration system of claim 1, wherein the processor is a general purpose processor that runs a software program to find the objective function minima.

7. A method of calibrating a linearity corrector comprising:
    inputting a first waveform and a second waveform into a signal processing system having an output;
    acquiring and analyzing the intermodulation and harmonic components of the first waveform and the second waveform as each is output from the signal processing system;
    finding the amplitude and phase response for filters to be used in a linearity corrector connected to the output of the device by determining the minima of an objective function based upon a distortion model and the intermodulation and harmonic components; and
    calculating a set of filter coefficients based upon the amplitude and phase response.

8. The method of claim 7, wherein the first waveform is a sine wave and the second waveform is a sine wave.

9. The method of claim 8, wherein the first waveform is a first integer multiple of an analysis frequency and the second waveform is a second integer multiple of the analysis frequency, and the first integer multiple is relatively prime with respect to the second integer multiple.

10. The method of claim 9, wherein the first integer multiple and the second integer multiple differ by two.

11. The method of claim 7, wherein the step of acquiring and analyzing the intermodulation and harmonic components further comprises testing for aliasing.

12. The method of claim 7, wherein the step of acquiring and analyzing the intermodulation and harmonic components comprises performing a DFT at selected harmonic and intermodulation frequencies that have been acquired.

13. The method of claim 7, wherein the step of acquiring and analyzing the intermodulation and harmonic components comprises performing an FFT and then extracting results for selected harmonic and intermodulation components.

14. The method of claim 7, wherein the minima of the objective function is found using a Newton-based algorithm.

15. The method of claim 14, wherein the Newton-based algorithm is a quasi-Newton algorithm.

16. The method of claim 15, wherein the quasi-Newton algorithm is implemented using a BFGS iteration formula.

17. The method of claim 16, wherein the BFGS iteration formula is used together with Fletcher's line search algorithm.

18. The method of claim 7, further comprising performing post solution correction to reduce amplitude dependent variations once the amplitude and phase responses have been found.

19. The method of claim 7, further comprising partitioning the amplitude and phase responses between available filters to improve overall smoothness of the amplitude response obtained for each filter.

20. The method of claim 7, wherein calculating a set of filter coefficients comprises calculating an inverse FFT.

21. The method of claim 7, wherein calculating a set of filter coefficients comprises iteratively calculating an inverse FFT and setting values beyond a predetermined filter length to zero, calculating a forward FFT and overwriting FFT bins in a region of interest to an initial set of values determined following the first iteration, while allowing values outside the region of interest to be unconstrained, until the inverse FFT results stabilize.

* * * * *